(12) United States Patent
Xu et al.

(10) Patent No.: US 12,133,437 B2
(45) Date of Patent: Oct. 29, 2024

(54) DISPLAY PANEL AND DISPLAY DEVICE

(71) Applicant: KunShan Go-Visionox Opto-Electronics Co., Ltd, Jiangsu (CN)

(72) Inventors: Chuanzhi Xu, Kunshan (CN); Lu Zhang, Kunshan (CN); Zhengfang Xie, Kunshan (CN); Zhenzhen Han, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 394 days.

(21) Appl. No.: 17/694,068

(22) Filed: Mar. 14, 2022

(65) Prior Publication Data

US 2022/0199710 A1 Jun. 23, 2022

Related U.S. Application Data

(63) Continuation of application No. PCT/CN2021/075340, filed on Feb. 4, 2021.

(30) Foreign Application Priority Data

Mar. 24, 2020 (CN) .......................... 202010214534.X

(51) Int. Cl.
*H01L 33/00* (2010.01)
*G06F 1/16* (2006.01)
(Continued)

(52) U.S. Cl.
CPC ......... *H10K 59/353* (2023.02); *G06F 1/1637* (2013.01); *H10K 59/86* (2023.02); *H04M 1/0266* (2013.01)

(58) Field of Classification Search
CPC .... H10K 59/353; H10K 59/86; H10K 59/121; H10K 59/131
(Continued)

(56) References Cited

U.S. PATENT DOCUMENTS 10,141,539 B2 11/2018 Suzuki et al.
2016/0275846 A1 9/2016 Gu
(Continued)

FOREIGN PATENT DOCUMENTS

CN 106920825 A 7/2017
CN 107148646 A 9/2017
(Continued)

OTHER PUBLICATIONS

International Search Report (with English Translation) and Written Opinion mailed Apr. 25, 2021, in corresponding International Application No. PCT/CN2021/075340, 14 pages.
(Continued)

*Primary Examiner* — Theresa T Doan
(74) *Attorney, Agent, or Firm* — Maier & Maier, PLLC

(57) ABSTRACT

A display panel and a display device. The display panel includes a first display area, a second display area and a transition display area between the first display area and the second display area. A light transmittance of the first display area is greater than a light transmittance of the second display area. The display panel includes a plurality of columns of first sub-pixels disposed in the transition display area arranged in a first direction, and each column of sub-pixels includes a plurality of first sub-pixels arranged in a second direction which intersects the first direction. A plurality of first pixel circuits corresponding to at least one column of first sub-pixels are distributed on a same column.

20 Claims, 8 Drawing Sheets

(51) Int. Cl.
  *H10K 59/35* (2023.01)
  *H10K 59/86* (2023.01)
  *H04M 1/02* (2006.01)
(58) Field of Classification Search
  USPC .......................................................... 257/89
  See application file for complete search history.

(56) References Cited

U.S. PATENT DOCUMENTS

2020/0052048 A1* 2/2020 Kuo ..................... H10K 59/123
2021/0359080 A1 11/2021 Xu et al.

FOREIGN PATENT DOCUMENTS

| CN | 107393458 A | 11/2017 |
| CN | 108054291 A | 5/2018 |
| CN | 108538206 A | 9/2018 |
| CN | 109285868 A | 1/2019 |
| CN | 109962092 A | 7/2019 |
| CN | 110046611 A | 7/2019 |
| CN | 110189706 A | 8/2019 |
| CN | 110277050 A | 9/2019 |
| CN | 110459175 A | 11/2019 |
| CN | 110504289 A | 11/2019 |
| CN | 104766875 B | 12/2019 |
| CN | 110767139 A | 2/2020 |
| CN | 110767712 A | 2/2020 |
| CN | 110767832 A | 2/2020 |
| CN | 110783384 A | 2/2020 |
| CN | 110783385 A | 2/2020 |
| CN | 110854178 A | 2/2020 |
| CN | 210120136 U | 2/2020 |
| CN | 110874990 A | 3/2020 |
| CN | 111402743 A | 7/2020 |
| CN | 111785761 A | 10/2020 |
| DE | 102018113096 A1 | 12/2019 |
| JP | 2009086212 A | 4/2009 |
| JP | 2012014168 A | 1/2012 |
| WO | 2019096097 A1 | 5/2019 |

OTHER PUBLICATIONS

The First Office Action issued on Jul. 5, 2021, in connection with corresponding Chinese Application No. 202010214534.X; 22 pages (including machine-generated English translation).
The Second Office Action issued on Jan. 13, 2022, in connection with corresponding Chinese Application No. 202010214534.X; 10 pages (including partial English translation).
The Third Office Action issued May 26, 2022 for Chinese Application No. 202010214534.X (with English translation); 10 pages.
Office Action issued on Apr. 11, 2023, in corresponding Japanese Application No. 2022-520246, 8 pages.
Extended European Search Report issued on Apr. 8, 2023, in corresponding European Application No. 21774645.2, 10 pages.
Search Report issued on Mar. 7, 2023, in corresponding Japanese Application No. 2022-520246, 49 pages.
The Decision of Refusal issued on Sep. 5, 2022, in connection with Chinese Application No. 202010214534.X (9 pages including partial English translation).

* cited by examiner

DISPLAY PANEL AND DISPLAY DEVICE

CROSS REFERENCE TO RELATED APPLICATIONS

The application is a continuation of International Application No. PCT/CN2021/075340 filed on Feb. 4, 2021, which claims priority to Chinese patent application No. 202010214534.X, filed on Mar. 24, 2020 and titled with "Display Panel and Display Device", each of which is incorporated herein by reference in its entirety.

TECHNICAL FIELD

The application relates to the field of display, in particular to a display panel and a display device.

BACKGROUND

With rapid development of electronic devices, users have higher and higher requirements for a screen-to-body ratio, and thereby a full-screen display of an electronic device attracts more and more attention in the industry.

A traditional electronic device, such as a mobile phone, a tablet computer and the like, is required to integrate a front camera, an earphone and an infrared sensing element. Traditionally, a notch or a hole is formed in a display screen so that external light can arrive at photosensitive elements under the screen through the notch or the hole of the screen. However, such a display screen actually is not a full screen and cannot enable display in all areas of the entire screen, for example, an area corresponding to a front camera cannot display images.

SUMMARY

The embodiments provide a display panel and a display device, at least a part of an area of the display panel is light-transmittable and is available to display, which facilitates an under-screen integration of a photosensitive component. The embodiments provide a display panel, including a first display area, a second display area and a transition display area between the first display area and the second display area, wherein a light transmittance of the first display area is greater than a light transmittance of the second display area, wherein the display panel includes: a plurality columns of first sub-pixels disposed in the transition display area and arranged along a first direction, wherein each column of first sub-pixels includes a plurality of first sub-pixels arranged in a second direction which intersects the first direction, and a plurality of first pixel circuits corresponding to at least one column of first sub-pixels are distributed on a same column.

According to any one of foregoing implementations of the application, the display panel may include a device layer, and the device layer includes a first metal layer, a second metal layer and a third metal layer which are sequentially stacked and insulated from each other, wherein first line segments, first transition segments and second line segments are located in the third metal layer, and second transition segments are located in the first metal layer or the second metal layer.

The embodiments also provide a display device, including the display panel which is mentioned above.

According to the display panel of the embodiments of the application, a light transmittance of the first display area is greater than a light transmittance of the second display area, so that the display panel can be integrated with a photosensitive component on back of the first display area to realize an under-screen integration of a photosensitive component such as a camera, and meanwhile the first display area is available to display images to increase a display area of the display panel, thereby realizing a full-screen design of the display device.

According to the display panel of the embodiments of the application, the display panel includes a plurality of columns of first sub-pixels disposed in the transition display area, wherein each column of first sub-pixels includes a plurality of first sub-pixels arranged in a second direction which intersects the first direction, and a plurality of first pixel circuits corresponding to at least one column of first sub-pixels are distributed on a same column By arranging a plurality of first pixel circuits corresponding to at least one column of first sub-pixels on a same column, an area occupied by the first pixel circuits corresponding to the column of first sub-pixels can be reduced, and a occupied space in the transition display area can be reduced, and more sub-pixels can be arranged in the transition display area and/or the first display area to improve a display effect of the display panel in a condition that the transition display area has a certain area.

DETAILED DESCRIPTION

The features and exemplary embodiments of various aspects of the application will be described in detail below. In order to make the purpose, technical solutions and advantages of the application clearer, the application will be described in detail with reference to the accompanying drawings and specific embodiments. It should be understood that the specific embodiments described herein are only intended to explain the application, but not to limit the application. For those skilled in the art, the application can be implemented without some of these specific details. The following description of the embodiments is only to provide a better understanding of the application by showing examples of the application.

In an electronic device such as a mobile phone and a tablet computer, it is required to integrate a photosensitive component such as a front camera, an infrared light sensor and a proximity light sensor at a side of the electronic device where a display panel is disposed. In some embodiments, a light-transmittable display area can be disposed on the electronic device and the photosensitive component is disposed on back of the light-transmittable display area so as to realize a full-screen display of the electronic device while ensuring a normal operation of the photosensitive component.

In order to increase a light transmittance of the light-transmittable display area, a transition display area is generally disposed between the light-transmittable display area and a main display area, and pixel circuits for the light-transmittable display area are disposed in the transition display area. In this way, not only pixel circuits for the transition display area but also pixel circuits for the light-transmittable display area are disposed in the transition display area, leading to an insufficient space in the transition display area.

In order to solve the above-mentioned problem, the embodiments of the application provide a display panel and a display device. The embodiments of the display panel and the display device will be described below with reference to the accompanying drawings.

According to the embodiments of the application, there is provided a display panel, which may be an organic light emitting diode (Organic Light Emitting Diode, OLED) display panel.

Figure 1:
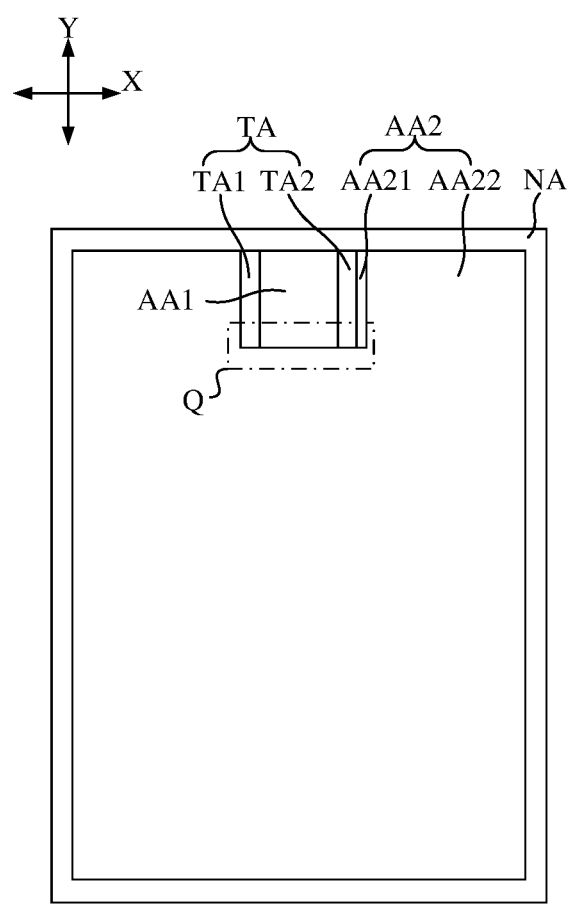
FIG. 1 shows a schematic top view of a display panel according to an embodiment of the application.
Figure 2:
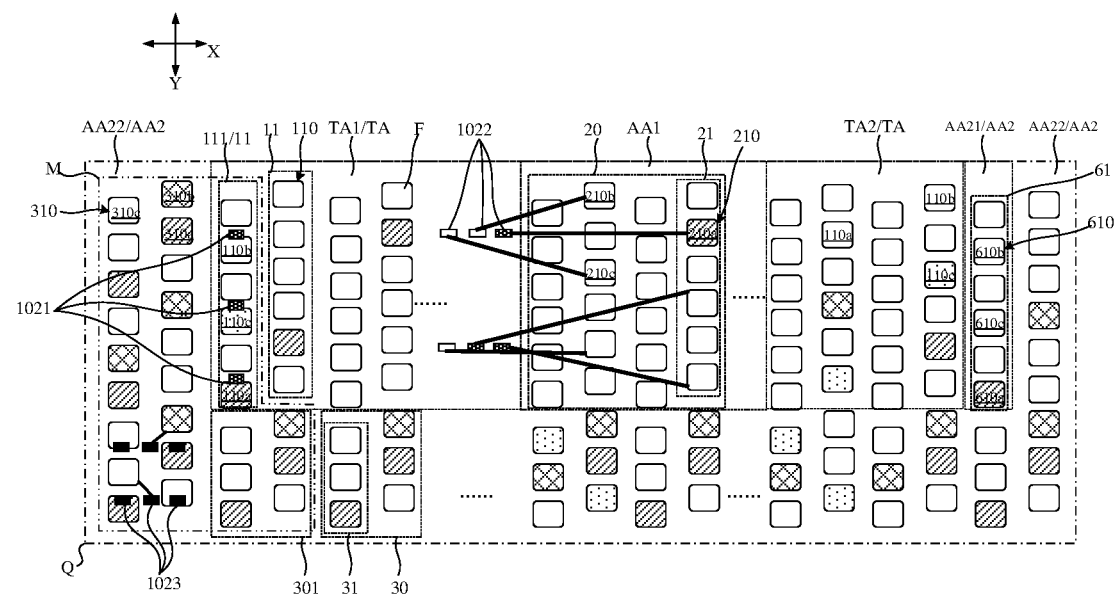
FIG. 2 shows a partial enlarged view of an example of an area Q shown in FIG. 1.

FIG. 1 shows a schematic top view of a display panel according to an embodiment of the application, and FIG. 2 shows a partial enlarged view of an example of an area Q shown in FIG. 1.

As shown in FIG. 1, the display panel 100 includes a first display area AA1, a second display area AA2, a transition display area TA, and a non-display area NA. The transition display area TA is located between the first display area AA1 and the second display area AA2. The non-display area NA surrounds the first display area AA1, the second display area AA2 and the transition display area TA. A light transmittance of the first display area AA1 is greater than a light transmittance of the second display area AA2.

Here, the light transmittance of the first display area AA1 may be greater than or equal to 15%. In order to ensure that the light transmittance of the first display area AA1 is greater than 15% or even 40% or even a higher light transmittance, at least a part of functional film layers of the display panel 100 in the embodiments may has a light transmittance greater than 80% or even 90%.

According to the display panel 100 of the embodiments of the application, the light transmittance of the first display area AA1 is greater than the light transmittance of the second display area AA2, so that the display panel 100 can be integrated with a photosensitive component on back of the first display area AA1 to realize an under-screen integration of a photosensitive component such as a camera, and meanwhile the first display area AA1 is available to display images to increase a display area of the display panel 100, thereby realizing a full-screen design of the display device.

The display panel 100 according to the embodiments of the application includes a plurality of columns 11 of first sub-pixels. The plurality of columns 11 of first sub-pixels are arranged in the transition display area TA and along a first direction X. Each column 11 of first sub-pixels includes a plurality of first sub-pixels 110 arranged in a second direction Y which intersects the first direction X, and a plurality of first pixel circuits 1021 corresponding to at least one column 11 of first sub-pixels are distributed on a same column.

In the embodiments of the application, the first direction X and the second direction Y intersect with each other. Optionally, one of the first direction X and the second direction Y may be a row direction of the display panel 100, and the other one is a column direction which is perpendicular to the row direction, wherein the "row" and the "column" are interchangeable.

As shown in FIG. 2, in the first direction X, the transition display area TA located at a left side of the first display area AA1 includes a plurality of columns 11 of first sub-pixels. Illustratively, a plurality of first pixel circuits 1021 corresponding to one column 11 of first sub-pixels in the transition display area TA which is adjacent to the second display area AA2 are arranged on a same column That is, in the second direction Y, the plurality of first pixel circuits 1021 corresponding to the column 11 of first sub-pixels occupy a space of only one column.

By arranging a plurality of first pixel circuits 1021 corresponding to at least one column 11 of first sub-pixels on a same column, an area occupied by the first pixel circuits 1021 corresponding to the column 11 of first sub-pixels is reduced, and an occupied space in the transition display area TA can be reduced, and more sub-pixels can be arranged in the transition display area TA and/or the first display area AA1 in a condition that the transition display area TA has a certain area, to improve a display effect of the display panel.

Figure 3:
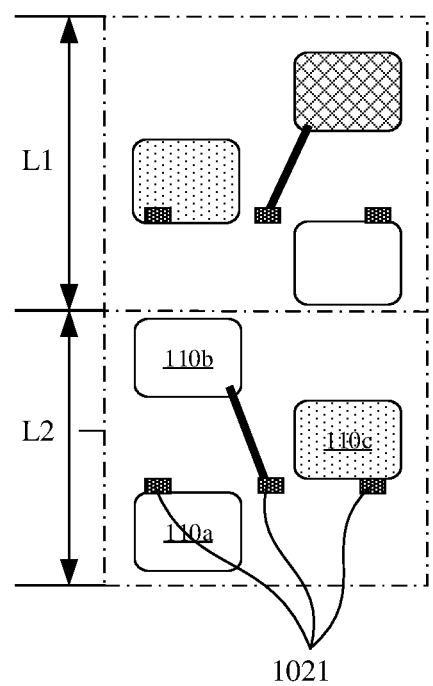
FIG. 3 shows a schematic distribution diagram of first sub-pixels and first pixel circuits according to a comparative example with respect to FIG. 2.
Figures 4, 5:
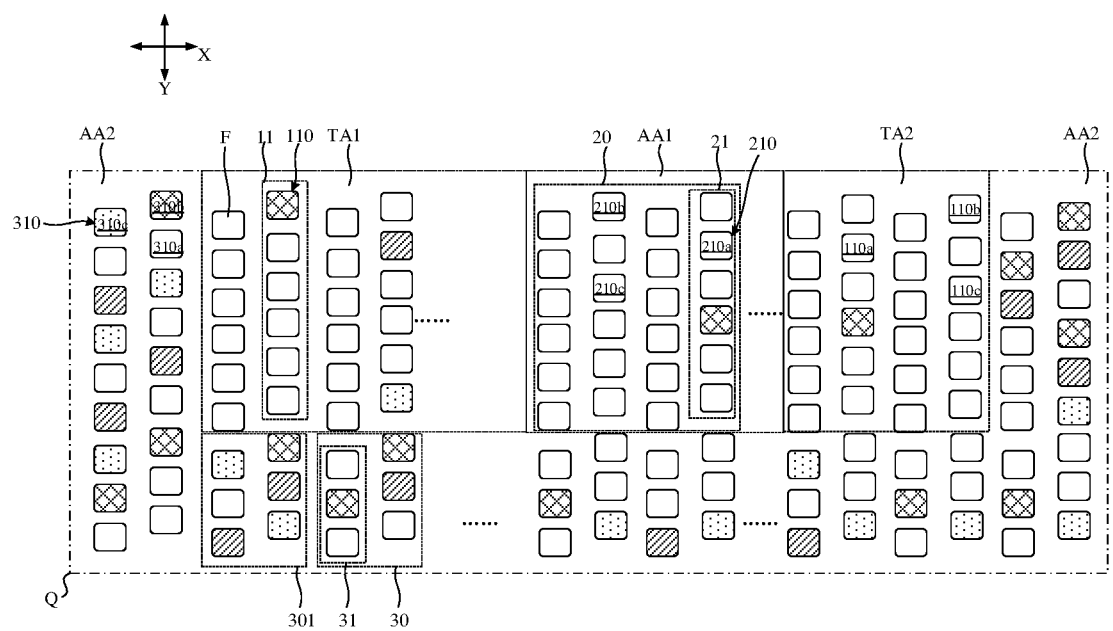
FIG. 4 shows a schematic diagram of electrical driving corresponding to the first sub-pixels and the first pixel circuits in the example of FIG. 3.
FIG. 5 shows a partial enlarged schematic top view of the area Q shown in FIG. 1 according to a comparative example with respect to FIG. 2.

In order to better understand that such arrangement that the plurality of first pixel circuits 1021 corresponding to the column 11 of first sub-pixels are arranged on a same column can achieve an effect of space saving, please refer to FIG. 3 and FIG. 4. FIG. 3 shows two columns 11 of first sub-pixels, and each column 11 of first sub-pixels includes a plurality of first sub-pixels 110. The plurality of first sub-pixels 110 correspond to a plurality of first pixel circuits 1021 in one-to-one correspondence. The label "first row (L1)" shown in FIG. 3 indicates a area for a connection between a scan line extending in the first row and the first pixel circuits 1021. The label "second row (L2)" shown in FIG. 3 indicates a area for a connation between a scan line extending in the second row and the first pixel circuits 1021. It can be clearly shown in FIG. 3 that the first pixel circuits 1021 corresponding to the plurality of first sub-pixels 110 are arranged in a matrix along the first direction X and the second direction Y.

In order to achieve that the first sub-pixels 110 which are adjacent to each other can be shared, adjacent first sub-pixels 110 which are electrically connected to a same scan line are generally provided with different colors. When the display panel 100 includes a plurality of first pixel circuits 1021, the first pixel circuits 1021 respectively corresponding to a first sub-pixel 110a of a first color, a first sub-pixel 110b of a second color and a first sub-pixel 110c of a third color are arranged sequentially along the first direction X, so that adjacent first sub-pixels 110 can be shared.

In FIG. 4, a first row is taken as an example for description. When first sub-pixels 110 in the first row are driven by a scan line, a first sub-pixel 110c of the third color in a first column, a first sub-pixel 110b of the second color in a second column and a first sub-pixel 110a of the first color in a third column forms a pixel unit.

As shown in FIGS. 3 and 4, the first pixel circuits 1021 corresponding to one column 11 of first sub-pixels occupy a space of two columns. By arranging a plurality of first pixel circuits 1021 corresponding to at least one column of first sub-pixels on a same column, an effect of saving space can be achieved.

In some embodiments, please continue to refer to FIG. 2, the transition display area TA includes a first transition display sub-area TA1 and a second transition display sub-area TA2. In the first direction X, the first display area AA1 is between the first transition display sub-area TA1 and the second transition display sub-area TA2.

In order to blur a boundary between the first display area AA1 and the second display area AA2, a sub-pixel distribution density corresponding to the first transition display sub-area TA1 and a sub-pixel distribution density corresponding to the second transition display sub-area TA2 may be respectively greater than or equal to a sub-pixel distribution density corresponding to the first display area AA1, and the sub-pixel distribution density corresponding to the first transition display sub-area TA1 and the sub-pixel distribution density corresponding to the second transition display sub-area TA2 may be respectively smaller than a sub-pixel distribution density corresponding to the second display area AA2.

Optionally, the sub-pixel distribution density corresponding to the first transition display sub-area TA1 may be greater than the sub-pixel distribution density corresponding to the first display area AA1, and the sub-pixel distribution density corresponding to the second transition display sub-area TA2 may be equal to the sub-pixel distribution density corresponding to the first display area AA1.

In order to better understand the effect of such arrangement that the sub-pixel distribution density corresponding to the first transition display sub-area TA1 is greater than the sub-pixel distribution density corresponding to the first display area AA1, please refer to FIG. 5. In FIG. 5, the sub-pixel distribution density corresponding to the first transition display sub-area TA1 is equal to the sub-pixel distribution density corresponding to the first display area AA1, and the sub-pixel distribution density corresponding to the first transition display sub-area TA1 is smaller than the sub-pixel distribution density corresponding to the second display area AA2, thus a dark stripe is easily formed at a boundary between the second display area AA2 with a higher pixel density and the first transition display sub-area TA1 with a lower pixel density, the "pixel density" refers to PPI (Pixels Per Inch).

In order to blur the dark stripe, some first sub-pixels 110 capable of emitting light can be formed at positions occupied by one column of virtual sub-pixels F of the first transition display sub-area TA1 which is adjacent to the second display area AA2 in FIG. 5, to obtain the first transition display sub-area TA1 as shown in FIG. 2. In FIG. 2, the column of first sub-pixels 110 capable of emitting light is disposed in the first transition display sub-area TA1 which is adjacent to the second display area AA2, so the dark stripe between the first transition display sub-area TA1 and the second display area AA2 can be blurred.

The virtual sub-pixels F can be understood that, under a rule of an arrangement of the sub-pixels, the virtual sub-pixels F occupy positions of real sub-pixels, that is, the positions occupied by the virtual sub-pixels F are non-light-emitting areas.

Compared with FIG. 5, it can be understood that one sub-column 111 of first sub-pixels of the first transition display sub-area TA1 which is adjacent to the second display area AA2 in FIG. 2 is provided additionally. A plurality of first pixel circuits 1021 corresponding to the additionally provided sub-column 111 of first sub-pixels can be distributed on a same column That is, the plurality of first pixel circuits 1021 corresponding to the sub-column 111 of first sub-pixels in the first transition display sub-area TA1 which is adjacent to the second display area AA2 are distributed on a same column In this way, the sub-column 111 of first sub-pixels and their corresponding first pixel circuits 1021 can be additionally provided without increasing an area of the first transition display sub-area TA1.

In some embodiments, as shown in FIG. 2, the sub-column 111 of first sub-pixels includes a plurality of first sub-pixels 110, and the sub-column 111 of first sub-pixels may include first sub-pixels 110 of three colors, which include a first sub-pixel 110a of a first color, a first sub-pixel 110b of a second color and a first sub-pixel 110c of a third color. Exemplarily, the first sub-pixel 110a of the first color can emit red light, the first sub-pixel 110b of the second color can emit green light, and the first sub-pixel 110c of the third color can emit blue light.

Figure 6:
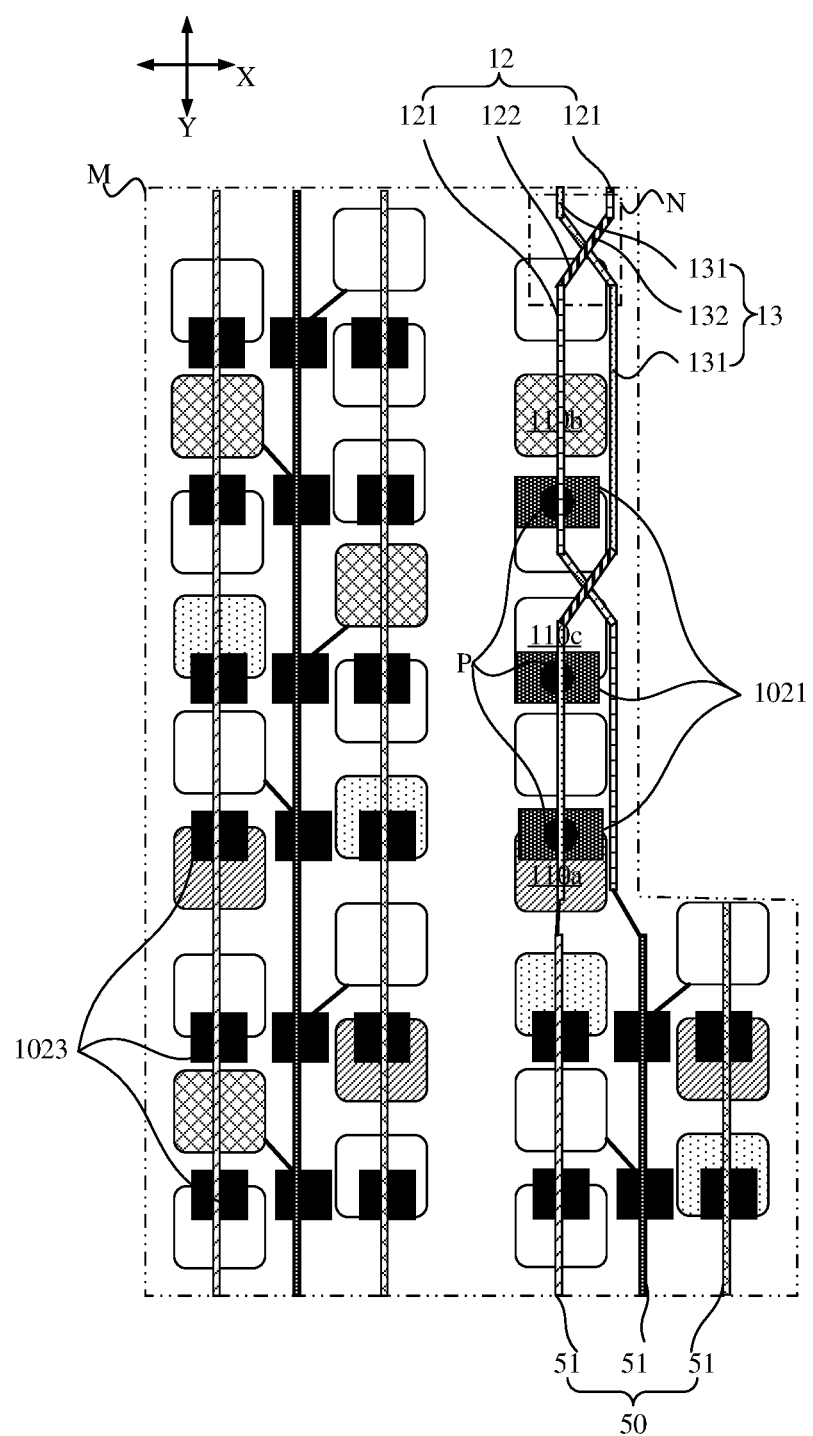
FIG. 6 shows a partial enlarged schematic diagram of an example of an area M shown in FIG. 2.

As shown in FIG. 6, the first sub-pixel 110a of the first color and the first sub-pixel 110c of the third color are electrically connected to a second signal line 13 through respective first pixel circuits 1021, and the first sub-pixel 110b of the second color is electrically connected to a first signal line 12 through a first pixel circuit 1021. In this way, each first sub-pixel 110 in the sub-column 111 of first sub-pixels can be shared with adjacent sub-pixels in the first direction X, thereby improving a display effect of the display panel.

Optionally, both the first signal line 12 and the second signal line 13 are data lines.

In some embodiments, please continue to refer to FIG. 6, the first signal line 12 and the second signal line 13 are interweaved and extend along the second direction Y. Specifically, the first signal line 12 includes a plurality of first line segments 121 and a plurality of first transition segments 122 which are alternately distributed in the second direction Y. The first line segment 121 extends along the second direction Y. In the second direction Y, two adjacent first line segments 121 are located in different columns and are electrically connected by a first transition segment 122. The second signal line 13 includes a plurality of second line segments 131 and a plurality of second transition segments 132 which are alternately distributed in the second direction Y. The second line segment 131 extends along the second direction Y. In the second direction Y, two adjacent second line segments 131 are located in different columns and are electrically connected by a second transition segment 123. The first signal line 12 and the second signal line 13 can be insulated at a position where they are interweaved, so as to avoid crosstalk between the first signal line 12 and the second signal line 13. By arranging the first signal line 12 and the second signal line 13 to be interweaved with each other and extend along the second direction Y, the first signal line 12 and the second signal line 13 can be arranged more closely, and the occupied space in the transition display area TA can be further reduced.

In some embodiments, in order to avoid crosstalk between the first signal line 12 and the second signal line 13, the first line segments 121 and the first transition segments 122 may be arranged in a same layer, and the second line segments 131 and the second transition segments 132 may be arranged in different layers. Optionally, the first line segment 121 and the second line segment 131 which are adjacent to each other in the first direction X are arranged in a same layer and arranged in parallel, and a projection of the first transition segment 122 corresponding to the first line segment 121 in a direction orthogonal to the display panel 100 intersects a projection of the second transition segment 132 corresponding to the second line segment 131 in a direction orthogonal to the display panel. That is, the first signal line 12 and the second signal line 13 are interweaved at the first transition segment 122 and the second transition segment 132, and the first transition segment 122 and the second transition segment 132 are located in different layers to avoid direct interweaving of the first transition segment 122 and the second transition segment 132.

Optionally, the first signal line 12 may be electrically connected to the first pixel circuits 1021 through the first line segments 121 at signal access points P. The second signal line 13 may be electrically connected to the first pixel circuits 1021 through the second line segments 131 at signal access points P. By using the first line segments 121 and the second line segments 131 which are not interweaved to electrically connect to corresponding first pixel circuits 1021, a possibility of interference between the first signal line 12 and the second signal line 13 can be reduced. As shown in FIG. 6, the first line segments 121 of the first signal line 12 and the second line segments 131 of the second signal line 13 directly pass through various signal access points P in their respective extending directions, without requiring additional wirings to connect the first line segments 121 and the second line segments 131 to corresponding signal access points P.

Figure 7:
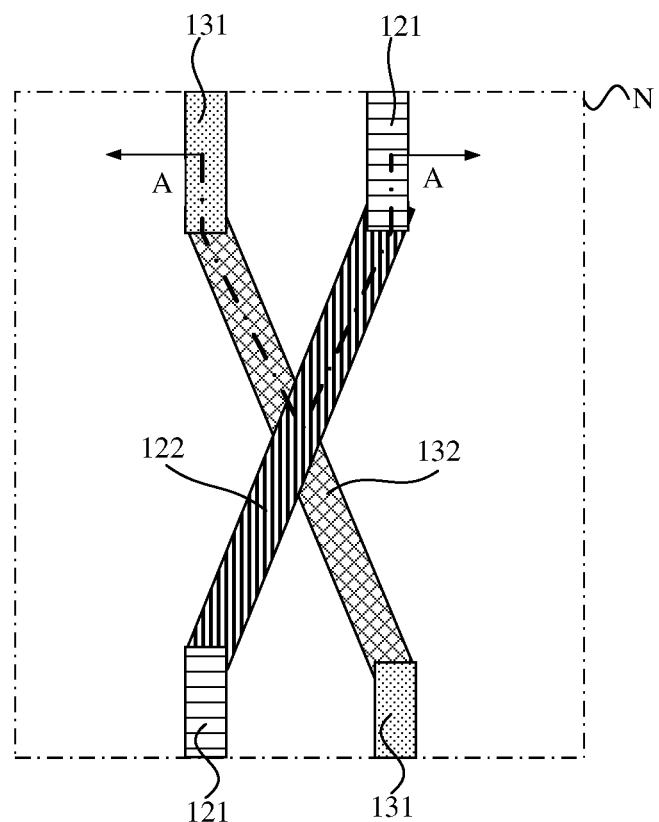
FIG. 7 shows a partial enlarged schematic diagram of an example of an area N in shown FIG. 6.
Figure 8:
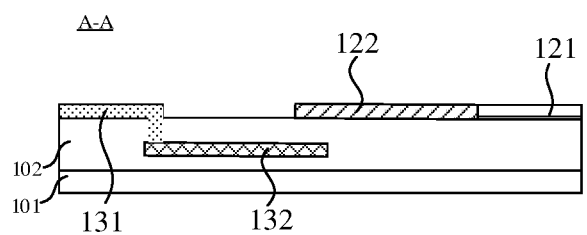
FIG. 8 shows a cross-sectional view of the example shown in FIG. 7 along a direction of A-A.

In some embodiments, the first line segments 121 and the first transition segments 122 may be arranged in a same layer, and the second line segments 131 and the second transition segments 132 may be arranged in different layers. Further, the first line segments 121, the first transition segments 122 and the second line segments 131 may be disposed in a same layer, and the second transition segments 132 are disposed in a different layer from the first line segments 121, the first transition segments 122 and the second line segments 131. As shown in FIGS. 7 and 8, the display panel 100 may include a device layer 102, and the device layer 102 may include a first metal layer, a second metal layer and a third metal layer sequentially stacked and insulated from each other. The first line segments 121, the first transition segments 122 and the second line segments 131 may be disposed in the third metal layer, and the second transition segments 132 may be disposed in the first metal layer or the second metal layer. A second line segment 131 may be connected to a corresponding second transition segment 132 through a through-hole. In this way, during a manufacturing process, the first line segments 121, the first transition segments 122, and the second line segments 131 can be formed at the same time, which can simplify the manufacturing process.

Exemplarily, the device layer 102 may be provided on a substrate 101. The substrate 101 may be made of light-transmittable materials such as glass and polyimide (PI). The pixel circuits used to drive sub-pixels of respective display areas to display and signal lines electrically connected to the pixel circuits may be provided in the device layer 102.

Figure 9:
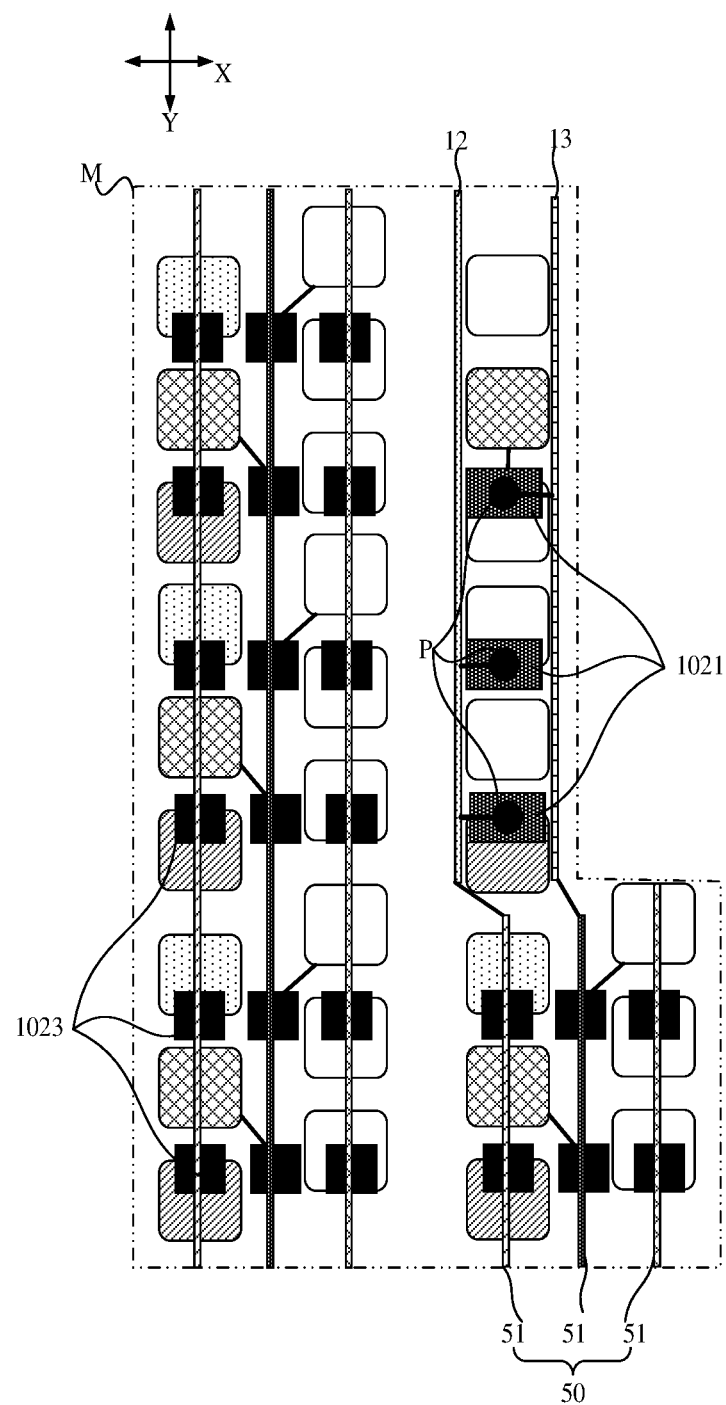
FIG. 9 shows a partial enlarged schematic diagram of another example of the area M shown in FIG. 2.

In some embodiments, referring to FIG. 9, the first signal line 12 and the second signal line 13 may extend along the second direction Y and be arranged in parallel. With this arrangement, a mutual interference between the first signal line 12 and the second signal line 13 can be better avoided. Optionally, the first signal line 12 and the second signal line 13 may be disposed in a same layer. Exemplarily, the first signal line 12 and the second signal line 13 may be disposed in the third metal layer of the device layer 102. In this way, during a manufacturing process, the first signal line 12 and the second signal line 13 can be formed at the same time, which can reduce complexity of the manufacturing process.

Figure 10:
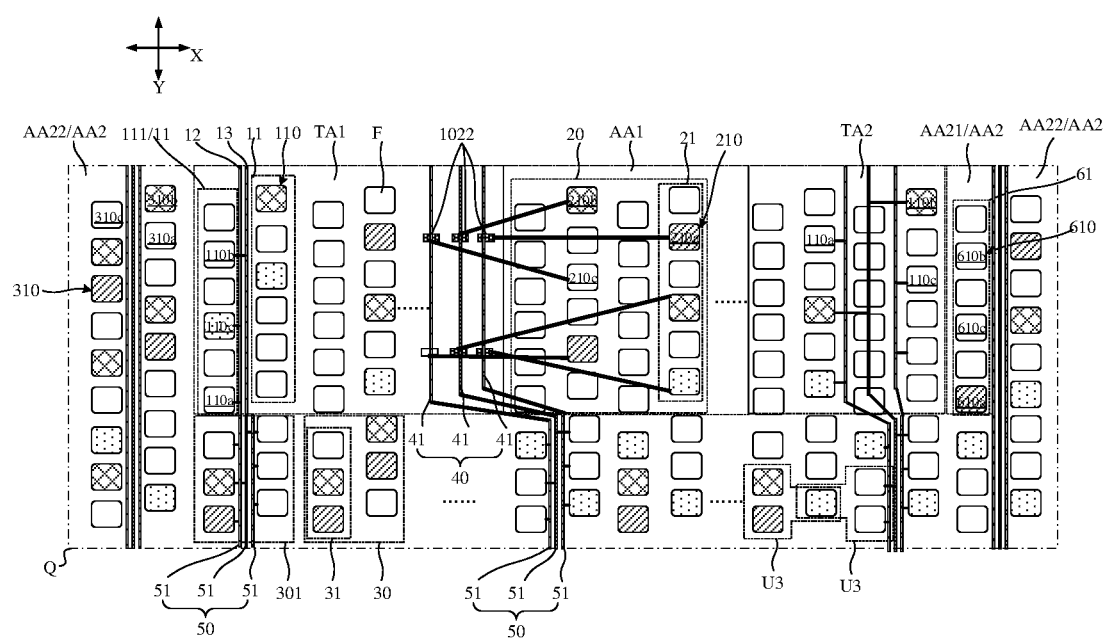
FIG. 10 shows a partial enlarged view of another example of the area Q shown in FIG. 1.

In some embodiments, please refer to FIG. 6 or FIG. 7 and FIG. 10, the display panel includes a plurality of second units 30 and a plurality of second line groups 50 in the second display area AA2. The second units 30 refers to a miniaturized unit which is arranged repeatively, the second line group 50 refers to a miniaturized line group which is arranged repeatively. FIG. 6, FIG. 7 and FIG. 10 show schematic diagrams of electrical connections between various signal lines and various sub-pixels, which do not indicate a specific location of a signal line.

The plurality of second units 30 are arranged along the first direction X in the second display area AA2, and each of the second units 30 includes at least two columns 31 of third sub-pixels arranged along the first direction X, and each column 31 of third sub-pixels includes a plurality of third sub-pixels 310 arranged along the second direction Y. The plurality of second line groups 50 are arranged along the first direction X in the second display area AA2, and each of the second line groups 50 includes at least two fourth signal lines 51 arranged along the first direction X, and the fourth signal line 51 extends along the second direction Y. The at least two fourth signal lines 51 in each of second line groups 50 are matched and electrically connected with a plurality of third sub-pixels 310 of a corresponding second unit 30 through third pixel circuits 1023.

In the display panel 100 according to the embodiments of the application, the second line groups 50 are repeatedly arranged, so that adjacent second line groups 50 can share a fourth signal line 51 with each other to satisfy a sharing of a third sub-pixel 310.

Exemplarily, each column 31 of third sub-pixels may include three third sub-pixels 310, which are respectively a third sub-pixel 310a of a first-color, a third sub-pixel 310b of a second color and a third sub-pixel 310c of a third color. The third sub-pixel 310a of the first color can emit red light, the third sub-pixel 310b of the second color can emit green light, and the third sub-pixel 310c of the third color can emit blue light. Six third sub-pixels 310 in each second unit 30 can form two third pixel units U3, and third sub-pixels 310 in adjacent second units 30 may be shared to form a third pixel unit U3. In this way, the PPI of the second display area AA2 can be increased, and the display effect of the display panel can thus be improved.

The second unit 30 includes a second sub-unit 301 which is adjacent to the sub-column 111 of first sub pixels in the second direction Y, and the first signal line 12 and the second signal line 13 are electrically connected with the two fourth signal lines 51 matched with the second sub-unit 301 in one-to-one correspondence.

As described above, with respect to FIG. 5, in order to blur the dark stripe between the first transition display sub-area TA1 and the second display area AA2, it can be understood that the sub-column 111 of first sub-pixels is provided additionally. By electrically connecting the first signal line 12 and the second signal line 13 with the two fourth signal lines 51 matched with the second sub-unit 301 in one-to-one correspondence, the first sub-pixels 110 in the sub-column 111 of first sub-pixels may have the same brightness as that of the third sub-pixels 310 in the second display area AA2, which further blurs the dark stripe between the first transition display sub-area TA1 and the second display area AA2.

In some embodiments, in order to transmit a stable electrical signal to corresponding first sub-pixels 110 and third sub-pixels 310 through the electrically connected first signal line 12 and the fourth signal line 51, the first sub-pixels 110 and the third sub-pixels 310 respectively connected with the first signal line 12 and the fourth signal line 51 (which are electrically connected with each other) may have the same color. Similarly, the first sub-pixels 110 and the third sub-pixels 310 respectively connected with the second signal line 13 and the fourth signal line 51 (which are electrically connected with each other) may have the same color. For example, the second signal line 13 is electrically connected to a first sub-pixel 110a of a first color and a first sub-pixel 110c of a third color, and the fourth signal line 51 which is electrically connected with the second signal line 13 can be electrically connected to a third sub-pixel 310a of the first color and a third sub-pixel 310c of the third color; the first signal line 12 is electrically connected to a first sub-pixel 110b of a second color, and the fourth signal line 51 that is electrically connected with the first signal line 12 can be electrically connected to a third sub-pixel 310b of the second color. Through the above arrangement, the first signal line 12 and the fourth signal line 51 which are electrically connected to each other can drive sub-pixels of the same display color, and the second signal line 13 and the fourth signal line 51 which are electrically connected to each other can drive sub-pixels of the same display color, thereby improving the display effect.

In some embodiments, please continue to refer to FIG. 10, display panel includes a plurality of first units 20 in the first display area AA1, and the display panel includes a plurality of first line groups 40 in the transition display area TA. The first units 20 refers to a miniaturized unit which is arranged repeatively, the first line group 40 refers to a miniaturized line group which is arranged repeatively The plurality of first units 20 are arranged along the first direction X in the first display area AA1, and each of the first unit 20 includes at least two columns 21 of second sub-pixels arranged along the first direction X, and each column 21 of second sub-pixels includes a plurality of second sub-pixels 210 arranged along the second direction Y. The plurality of first line groups 40 are arranged along the first direction X in the transition display area TA, and each of the first line groups 40 includes at least two third signal lines 41 arranged along the first direction X, and the third signal line extends along the second direction Y. The at least two third signal lines 41 in each of the first line groups 40 are matched and electrically connected with a plurality of second sub-pixels 210 of a corresponding one of the first units 20 through second pixel circuits 1022 in the transition display area TA.

The third signal lines 41 in the plurality of first line groups 40 are selectively electrically connected with the fourth signal lines 51 in the plurality of second line groups 50 other than the fourth signal lines 51 matched with the second sub-unit 301.

In the display panel 100 according to the embodiments of the application, the first line groups 40 are repeatedly arranged, so that the third signal lines 41 in adjacent first line groups 40 can be shared with each other, to satisfy a sharing of the second sub-pixels 210. Since the third signal lines 41 in the plurality of first line groups 40 are selectively electrically connected with the fourth signal line 51 in the plurality of second line groups 50 other than the fourth signal lines 51 matched with the second sub-unit 301, the fourth signal lines 51 and the third signal lines 41 which are connected with each other can be formed synchronously, and on the other hand, the number of third signal lines 41 can be reduced, so that the light transmittance of the first display area AA1 can be effectively increased, a photosensitive component 200 can be integrated on back of the display panel 100, a under-screen integration of a photosensitive component 200 such as a camera can be realized.

Exemplarily, each column 21 of second sub-pixels may include three second sub-pixels 210, which are respectively a second sub-pixel 210a of a first color, a second sub-pixel 210b of a second color and a second sub-pixel 210c of a third color. The second sub-pixel 210a of the first color can emit red light, the second sub-pixel 210b of the second color can emit green light, and the second sub-pixel 210c of the third color can emit blue light. Six second sub-pixels 210 in each first unit 20 can form two second pixel units, and the second sub-pixels 210 in adjacent first units 20 may be shared to form a second pixel unit. In this way, the PPI of the first display area AA1 can be increased, and the display effect of the display panel can thus be improved.

In the embodiments of the application, in order to increase the light transmittance of the first display area AA1, the third signal lines 41 and the second pixel circuits 1022 corresponding to the second sub-pixels 210 in the first display area AA1 are all disposed in the transition display area TA. Exemplarily, in the first direction X, all of the third signal lines 41 and the second pixel circuits 1022 corresponding to the second sub-pixels 210 which are close to the first transition display sub-area TA1 can be disposed in the first transition display sub-area TA1. Exemplarily, in the first direction X, all of the third signal lines 41 and the second pixel circuits 1022 corresponding to the second sub-pixels 210 which are close to the second transition display sub-area TA2 can be disposed in the second transition display sub-area TA2.

In order to simplify arrangement of the signal lines and the sub-pixels, accurate and stable connections between the third signal line 41 and the second sub-pixels 210 and accurate and stable connections between the fourth signal lines 51 and the third sub-pixels 310 are provided. In some embodiments, the number of the columns 31 of third sub-pixels in each second unit 30 is the same as the number of the columns 21 of second sub-pixels in each first unit 20, and the number of the fourth signal lines 51 in each second line group 50 may be the same as the number of the third signal lines 41 in each first line group 40. Optionally, each first line group 40 includes three third signal lines 41, and each second line group 50 includes three fourth signal lines 51.

In order to transmit a stable electrical signal to corresponding second sub-pixels 210 and third sub-pixels 310 through the electrically connected third signal lines 41 and the fourth signal lines 51, in some embodiments, the second sub-pixels 210 and the third sub-pixels 310 respectively connected with the third signal line 41 and the fourth signal line 51 (which are electrically connected with each other) may have the same color. Through the arrangement, the third signal line 41 and the fourth signal line 51 which are electrically connected to each other can drive sub-pixels of the same display color, thereby improving the display effect.

In some embodiments, please continue to refer to FIG. 10, the second display area AA2 may include a first display sub-area AA21 and a second display sub-area AA22. In the first direction X, the first display sub-area AA21 is located between the second transition display sub-area TA2 and the second display sub-area AA22, and a sub-pixel distribution density corresponding to the first display sub-area AA21 is smaller than a sub-pixel distribution density corresponding to the second display sub-area AA22.

In order to better understand the effect of such arrangement that the sub-pixel distribution density corresponding to the first display sub-area AA21 is smaller than the sub-pixel distribution density corresponding to the second display sub-area AA22, please refer to FIG. 5. In FIG. 5, the sub-pixel distribution density corresponding to the second transition display sub-area TA2 is smaller than the sub-pixel distribution density corresponding to the second display area AA2, thus a bright stripe is easily formed at a boundary between the second display area AA2 with a higher pixel density and the second transition display sub-area TA2 with a lower pixel density, the "pixel density" refers to PPI (Pixels Per Inch).

In order to blur the bright stripe, a column of sub-pixels in the second display area AA2 which is adjacent to the second transition display sub-area TA2 in FIG. 5 can be reduced, to obtain the first display sub-area AA21 as shown in FIG. 10, thereby the bright stripe between the second transition display sub-area TA2 and the second display area AA2 can be blurred. For example, a column of sub-pixels in the second display area AA2 which is adjacent to the second transition display sub-area TA2 in FIG. 5 can be halved. A distance between two four sub-pixels 610 which are adjacent to each other in the second direction Y in the first display sub-area AA21 may be twice a distance of two third sub-pixels 310 which are adjacent to each other in the second direction Y in the second display sub-area AA22.

Optionally, in order to better blur the bright stripe, the display panel may include only one column 61 of fourth sub-pixels in the first display sub-area AA21, and the column 61 of fourth sub-pixels includes a plurality of fourth sub-pixels 610 arranged along the second direction Y. The column 61 of fourth sub-pixels may include the fourth sub-pixels 610 of at least three colors. Every two adjacent fourth sub-pixels 610 have different colors. For example, the fourth sub-pixels 610 includes a fourth sub-pixel 610a of a first color, a fourth sub-pixel 610b of a second color and a fourth sub-pixel 610c of a third-color. The fourth sub-pixel 610a of the first color can emit red light, the fourth sub-pixel 610b of the second color can emit green light, and the fourth sub-pixel 610c of the third color can emit blue light.

As shown in the figure, the column 61 of fourth sub-pixels and the adjacent column 31 of third sub-pixels share fourth signal lines 51 in a second line group 50, so that the fourth sub-pixels 610 and the third sub-pixels 610 have the same brightness, thereby better blurring the bright stripe.

In addition, in a particular implementation, the first sub-pixels 110, the second sub-pixels 210, the third sub-pixels 310 and the fourth sub-pixels 410 can be manufactured by using a same mask during manufacturing, while those positions where there is no need to set a sub-pixel can be occluded, and finally the pixel arrangement structure shown in FIG. 2 is formed. The occlusion can be performed in alterlaced rows and/or alterlaced columns.

In some embodiments, a circuit structure of the first pixel circuit 1021, the second pixel circuit 1022 and the third pixel circuit 1023 may be any one of a 2T1C circuit, a 3T1C circuit, a 6T1C circuit, a 6T2C circuit, a 7T1C circuit, a 7T2C circuit, or a 9T1C circuit. In this document, the term "2T1C circuit" refers to a pixel circuit including two thin film transistors (T) and one capacitor (C) therein. The other terms "7T1C circuit", "7T2C circuit" and "9T1C circuit" and the like are interpreted in the same manner.

In some embodiments, each of the first sub-pixel 110, the second sub-pixel 210, the third sub-pixel 310 and the fourth sub-pixel 410 include a light-emitting structure, a first electrode, and a second electrode (not shown in the figures). The first electrode is disposed at a side of the light-emitting structure facing to the substrate 101, and the second electrode is disposed at a side of the light-emitting structure facing away from the substrate 101.

One of the first electrode and the second electrode acts as an anode, and the other one acts as a cathode. In the embodiments, the description is made by taking the first electrode being an anode and the second electrode being a cathode as an example.

The light-emitting structure may include an OLED light-emitting layer, and according to design requirements for the light-emitting structure, it may also include at least one of a hole injection layer, a hole transport layer, an electron injection layer, and an electron transport layer.

In some embodiments, a first electrode of the second sub-pixel 210 in the first display area AA1 is a light-transmittable electrode. In some embodiments, the first electrode of the second sub-pixel 210 includes an indium tin oxide (Indium Tin Oxide, ITO) layer or an indium zinc oxide layer. In some embodiments, the first electrode of the second sub-pixel 210 is a reflective electrode, including a first light-transmittable conductive layer, a reflective layer on the first light-transmittable conductive layer and a second light-transmittable conductive layer on the reflective layer. The first light-transmittable conductive layer and the second light-transmittable conductive layer may be ITO, indium zinc oxide, etc., and the reflective layer may be a metal layer, for example, made of silver.

In some embodiments, a second electrode of the second sub-pixel 210 includes a magnesium-silver alloy layer. In some embodiments, the second electrodes of the second sub-pixels 210 may be interconnected as a common electrode.

In some embodiments, an orthographic projection of each light-emitting structure of the first display area AA1 on the substrate 101 is composed of one first graphic unit or a splicing of two or more first graphic units. The first graphic unit includes at least one selected from a group including a circle, an oval, a dumbbell, a gourd, and a rectangle.

In some embodiments, an orthographic projection of each first electrode of the first display area AA1 on the substrate 101 is composed of one second graphic unit or a splicing of two or more second graphic units. The second graphic unit includes at least one selected from a group including a circle, an oval, a dumbbell, a gourd, and a rectangle.

The above-mentioned shapes can cause a change in a periodic structure produced by diffraction, that is, a change in distribution of a diffraction field, so as to reduce a diffraction effect generated when external incident light passes through the first display area AA1, thereby ensuring that images captured by a camera disposed under the first display area AA1 have a higher definition.

Exemplarily, the display panel 100 may further include an encapsulation layer, and a polarizer as well as a cover plate above the encapsulation layer, or a cover plate above the encapsulation layer without the polarizer. Alternatively, at least a cover plate is provided directly above the encapsulation layer of the first display area AA1 without a polarizer, so as to prevent the polarizer from affecting light collection of a corresponding photosensitive element disposed under the first display area AA1. Of course, a polarizer can be additionally provided above the encapsulation layer of the first display area AA1.

The embodiments of the present application also provide a display device, which may include the display panel 100 of any one of the foregoing embodiments. The following will take a display device according to an embodiment as an example for description. In the embodiment, the display device includes the display panel 100 according to the above-mentioned embodiments.

Figure 11:
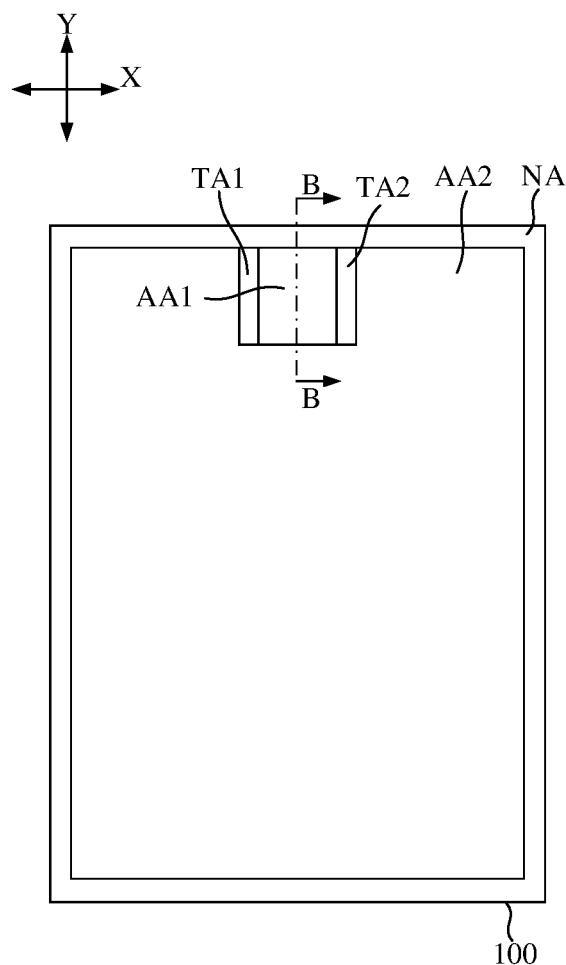
FIG. 11 shows a schematic top view of a display device according to an embodiment of the present application.
Figure 12:
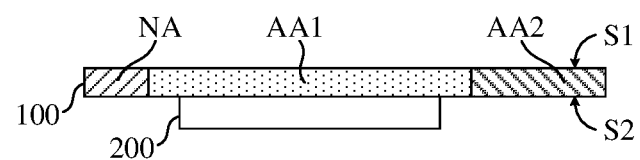
FIG. 12 shows a cross-sectional view of the example shown in FIG. 11 along a direction of B-B.

FIG. 11 shows a schematic top view of a display device according to an embodiment of the present application, and FIG. 12 shows a cross-sectional view of the example as shown in FIG. 11 along the B-B direction. In the display device of the embodiment, the display panel 100 may be the display panel 100 according to any one of the above embodiments. The display panel 100 includes a first display area AA1, a second display area AA2, and a transition display area TA between the first display area AA1 and the second display area AA2, and a light transmittance of the first display area AA1 is greater than a light transmittance of the second display area AA2.

The display panel 100 includes a first surface S1 and a second surface S2 which are opposite to each other, wherein the first surface S1 is a display surface. The display device further includes a photosensitive component 200, which is disposed on a side of the display panel 100 where the second surface S2 is disposed, and a position of the photosensitive component 200 corresponds to the first display area AA1.

The photosensitive component 200 may be an image capture device for capturing external image information. In this embodiment, the photosensitive component 200 is a complementary metal oxide semiconductor (Complementary Metal Oxide Semiconductor, CMOS) image capture device. In some other embodiments, the photosensitive component 200 may be a charge-coupled device (Charge-coupled Device, CCD) image capture device or any other form of image capture device. It should be understood that the photosensitive component 200 may not be limited to an image capture device. For example, in some embodiments, the photosensitive component 200 may be an optical sensor such as an infrared sensor, a proximity sensor, an infrared lens, a flood light sensor, an ambient light sensor and a dot projector or the like. In addition, the display device may be further integrated with other components on a side of the display panel 100 where the second surface S2 is disposed, such as a receiver, a speaker, and the like.

According to the display device of the embodiments of the application, a light transmittance of the first display area AA1 is greater than a light transmittance of the second display area AA2, so that the display panel 100 can be integrated with a photosensitive component 200 on back of the first display area AA1, to realize, for example, under-screen integration of the photosensitive component 200 such as an image capture device, and meanwhile the first display area AA1 is available to display images to increase a display area of the display panel 100, thereby realizing a full-screen design of the display device.

According to the display device of the embodiments of the application, a plurality of columns 11 of first sub-pixels are arranged along a first direction X in the transition display area TA, and each column 11 of sub-pixels includes a plurality of first sub-pixels 110 arranged along a second direction Y which intersects the first direction X. A plurality of first pixel circuits 1021 corresponding to at least one column 11 of first sub-pixels are distributed on a same column By arranging a plurality of first pixel circuits 1021 corresponding to at least one column 11 of first sub-pixels on a same column, an area occupied by the first pixel circuits 1021 corresponding to the column 11 of first sub-pixels can be reduced, and an occupied space in the transitional display area TA can be reduced, and under a certain area of the transition display area TA, more sub-pixels can be provided in the transition display area TA and/or the first display area AA1, to improve a display effect of the display panel.

The above-mentioned embodiments of the application do not describe all the details in detail, nor do they limit the scope of the application. Obviously, based on the above description, those skilled in the art can make various modifications and changes. This specification specifically describes these embodiments in order to better explain principles and practical applications of the application, so that those skilled in the art can make good use of the application and make modification and utilization on the basis of the application. The scope of the application is limited only by the appended claims.

What is claimed is:

1. A display panel, comprising:
   a first display area;
   a second display area; and
   a transition display area between the first display area and the second display area, wherein a light transmittance of the first display area is greater than a light transmittance of the second display area, the transition display area comprises a first transition display sub-area and a second transition display sub-area, and in the first direction, the first display area is located between the first transition display sub-area and the second transition display sub-area, a plurality of columns of first sub-pixels is disposed in the transition display area and arranged along a first direction, each column of first sub-pixels comprises a plurality of first sub-pixels arranged in a second direction which intersects the first direction, and a plurality of first pixel circuits corresponding to at least one column of first sub-pixels is distributed on a same column.

2. The display panel according to claim 1, wherein a sub-pixel distribution density corresponding to the first transition display sub-area and a sub-pixel distribution density corresponding to the second transition display sub-area are respectively greater than or equal to a sub-pixel distribution density corresponding to the first display area, and the sub-pixel distribution density corresponding to the first transition display sub-area and the sub-pixel distribution density corresponding to the second transition display sub-area are respectively smaller than a sub-pixel distribution density corresponding to the second display area.

3. The display panel according to claim 2, wherein the sub-pixel distribution density corresponding to the first transition display sub-area is greater than the sub-pixel distribution density corresponding to the first display area, and the sub-pixel distribution density corresponding to the second transition display sub-area is equal to the sub-pixel distribution density corresponding to the first display area.

4. The display panel according to claim 1, wherein the columns of first sub-pixels comprise a sub-column of first sub-pixels adjacent to the second display area, and a plurality of first pixel circuits corresponding to the sub-column of first sub-pixels is distributed on a same column.

5. The display panel according to claim 4, wherein the first sub-pixels in the sub-column of first sub-pixels comprise a first sub-pixel of a first color, a first sub-pixel of a second color and a first sub-pixel of a third color, the first sub-pixel of the first color and the first sub-pixel of the third color are electrically connected to a first signal line through respective first pixel circuits, and the first sub-pixel of the second color is electrically connected to a second signal line through a first pixel circuit.

6. The display panel according to claim 5, wherein the first signal line and the second signal line are interweaved with each other and extend along the second direction, the first signal line comprises a plurality of first line segments and a plurality of first transition segments which are distributed alternately in the second direction, and two of the first line segments which are adjacent to each other in the second direction are disposed in different columns and electrically connected through one of the first transition sections, and the second signal line comprises a plurality of second line segments and a plurality of second transition segments which are distributed alternately in the second direction, and two of the second line segments which are adjacent to each other in the second direction are disposed in different columns and electrically connected through one of the second transition sections.

7. The display panel according to claim 6, wherein the first line segments and the first transition segments are disposed in a same layer, and the second line segments and the second transition segments are disposed in different layers.

8. The display panel according to claim 6, wherein the first line segment and the second line segment which are adjacent to each other in the first direction are disposed in a same layer and arranged in parallel, and the first transition segment corresponding to the first line segment and the second transition segment corresponding to the second line segment are disposed in different layers, and a projection of the first transition segment in a direction orthogonal to the display panel intersects a projection of the second transition segment in a direction orthogonal to the display panel.

9. The display panel according to claim 6, wherein the first signal line is electrically connected to a corresponding first pixel circuit through the first line segment, and the second signal line is electrically connected to a corresponding first pixel circuit through the second line segment.

10. The display panel according to claim 6, wherein the display panel comprises a device layer, and the device layer comprises a first metal layer, a second metal layer and a third metal layer which are sequentially stacked and insulated from each other; wherein the first line segments, the first transition segments and the second line segments are disposed in the third metal layer, and the second transition segments are disposed in the first metal layer or the second metal layer.

11. The display panel according to claim 5, wherein the first signal line and the second signal line extend along the second direction and are arranged in parallel, and the first signal line and the second signal line are disposed in a same layer.

12. The display panel according to claim 5, further comprising:
a plurality of second units arranged along the first direction in the second display area, wherein each of the second units comprises at least two columns of third sub-pixels arranged along the first direction and, each column of third sub-pixels comprises a plurality of third sub-pixels arranged along the second direction;
a plurality of second line groups arranged along the first direction in the second display area, wherein each of the second line groups comprises at least two fourth signal lines arranged along the first direction, and the fourth signal line extends along the second direction, wherein the at least two fourth signal lines in each of the second line groups are matched and electrically connected with a plurality of third sub-pixels of a corresponding one of the second units through third pixel circuits; and the second units comprise a second sub-unit which is adjacent to the sub-column of first sub-pixels in the second direction, wherein the first signal line and the second signal line are electrically connected with two fourth signal lines matched with the second sub-unit in a one-to-one correspondence.

13. The display panel according to claim 12, further comprising:
a plurality of first units arranged along the first direction in the first display area, wherein each of the first units comprises at least two columns of second sub-pixels arranged along the first direction and, each column of second sub-pixels comprises a plurality of second sub-pixels arranged along the second direction;
a plurality of first line groups arranged along the first direction in the transition display area, wherein each of the first line groups comprises at least two third signal lines arranged along the first direction, and the third signal line extends along the second direction, wherein the at least two third signal lines in each of the first line groups are matched and electrically connected with a plurality of second sub-pixels of a corresponding one of the first units through second pixel circuits in the transition display area; and
the third signal lines in the plurality of first line groups are selectively electrically connected with the fourth signal lines in the plurality of second line groups other than the fourth signal lines matched with the second sub-unit-.

14. The display panel according to claim 13, wherein the number of the third signal lines in each of the first line groups is equal to the number of the fourth signal lines in each of the second line groups.

15. The display panel according to claim 12, wherein the second display area comprises a first display sub-area and a second display sub-area, in the first direction, the first display sub-area is between the second transition display sub-area and the second display sub-area, and a sub-pixel distribution density corresponding to the first display sub-area is smaller than a sub-pixel distribution density corresponding to the second display sub-area.

16. A display panel comprising:
a first display area;
a second display area; and
a transition display area between the first display area and the second display area, wherein a light transmittance of the first display area is greater than a light transmittance of the second display area, the transition display area comprises a first transition display sub-area and a second transition display sub-area, in the first direction, the first display area is located between the first transition display sub-area and the second transition display sub-area, and a sub-pixel distribution density corresponding to the first transition display sub-area and a sub-pixel distribution density corresponding to the second transition display sub-area are respectively greater than or equal to a sub-pixel distribution density corresponding to the first display area.

17. The display panel according to claim 16, further comprising:
a plurality of first sub-pixels disposed in the transition display area, wherein the plurality of first sub-pixels comprises a first sub-pixel of a first color, a first sub-pixel of a second color and a first sub-pixel of a third color, the first sub-pixel of the first color and the first sub-pixel of the third color are electrically connected to a first signal line through respective first pixel circuits, and the first sub-pixel of the second color is electrically connected to a second signal line through a first pixel circuit.

18. The display panel according to claim 17, wherein the first signal line and the second signal line extend along the second direction and are arranged in parallel, and the first signal line and the second signal line are disposed in a same layer.

19. The display panel according to claim 17, further comprising:
- a plurality of second units arranged along the first direction in the second display area, wherein each of the second units comprises at least two columns of third sub-pixels arranged along the first direction and each column of third sub-pixels comprises a plurality of third sub-pixels arranged along the second direction;
- a plurality of second line groups arranged along the first direction in the second display area, wherein each of the second line groups comprises at least two fourth signal lines arranged along the first direction, and the fourth signal line extends along the second direction, and the at least two fourth signal lines in each of the second line groups are matched and electrically connected with a plurality of third sub-pixels of a corresponding one of the second units through third pixel circuits.

20. The display panel according to claim 19, further comprising:
- a plurality of first units in the first display area, wherein each of the first units comprises a plurality of second sub-pixels; and
- a plurality of first line groups arranged along the first direction in the transition display area, wherein each of the first line groups comprises at least two third signal lines arranged along the first direction, and the third signal line extends along the second direction, the at least two third signal lines in each of the first line groups are matched and electrically connected with a plurality of second sub-pixels of a corresponding one of the first units through second pixel circuits, and the number of the third signal lines in each of the first line groups is equal to the number of the fourth signal lines in each of the second line groups.

* * * * *